(12) United States Patent
Heo et al.

(10) Patent No.: US 9,590,201 B2
(45) Date of Patent: Mar. 7, 2017

(54) ORGANIC LIGHT EMITTING DIODE DISPLAY

(71) Applicant: LG DISPLAY CO., LTD., Seoul (KR)

(72) Inventors: Jeonghaeng Heo, Paju-si (KR); Taesun Yoo, Goyang-si (KR); Taeshick Kim, Yongin-si (KR); Seung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 8 days.

(21) Appl. No.: 14/475,073

(22) Filed: Sep. 2, 2014

(65) Prior Publication Data

US 2015/0060829 A1  Mar. 5, 2015

(30) Foreign Application Priority Data

Sep. 2, 2013  (KR) .................. 10-2013-0104765

(51) Int. Cl.
| | |
|---|---|
| H01L 51/52 | (2006.01) |
| H01L 51/50 | (2006.01) |
| H01L 51/54 | (2006.01) |
| H01L 51/56 | (2006.01) |
| H01L 27/32 | (2006.01) |

(52) U.S. Cl.
CPC ........ H01L 51/5088 (2013.01); H01L 27/322 (2013.01); H01L 27/3211 (2013.01); H01L 51/5044 (2013.01); H01L 51/5092 (2013.01); H01L 2251/558 (2013.01)

(58) Field of Classification Search
CPC ............. H01L 51/5012; H01L 51/5036; H01L 51/5056; H01L 51/5072; H01L 51/5088; H01L 51/5092; H01L 51/5206; H01L 51/5221; H01L 2251/55; H01L 27/3211; H01L 27/3244; H01L 27/3281; G09G 3/3208; G09G 3/3216; G09G 3/3255; G09G 3/3233; G09G 3/3258

See application file for complete search history.

(56) References Cited

U.S. PATENT DOCUMENTS

| | | |
|---|---|---|
| 3,004,189 A1 | 8/2011 | Hasegawa et al. |
| 2003/0168972 A1 | 9/2003 | Hamada et al. |
| 2012/0104423 A1* | 5/2012 | Kurata ................. H05B 33/28 257/88 |
| 2012/0286318 A1 | 11/2012 | Lee et al. |

(Continued)

FOREIGN PATENT DOCUMENTS

| | | |
|---|---|---|
| CN | 1638581 A | 7/2005 |
| CN | 101855741 A | 10/2010 |

(Continued)

*Primary Examiner* — Pamela E Perkins
(74) *Attorney, Agent, or Firm* — Dentons US LLP

(57) ABSTRACT

An organic light emitting diode display has uniform light emission efficiency over the entire pixel area. The organic light emitting diode display comprises: a substrate having a red pixel area, a green pixel area, and a blue pixel area arrayed in a matrix; an anode electrode in the red, green, and blue pixel areas; a hole injection layer including an organic material with an extinction coefficient less than about 0.13 and on the anode electrode covering a whole surface of the substrate; an emission layer on the hole injection layer; an electron injection layer on a whole surface of the emission layer; and a cathode electrode on a whole surface of the electron injection layer.

9 Claims, 7 Drawing Sheets

(56) References Cited

U.S. PATENT DOCUMENTS

| | | | | |
|---|---|---|---|---|
| 2013/0154478 A1* | 6/2013 | Ohe | ...................... | H01L 27/322 |
| | | | | 315/85 |
| 2015/0041787 A1* | 2/2015 | Malik | ................... | H01L 51/445 |
| | | | | 257/40 |
| 2015/0179971 A1* | 6/2015 | Yamana | .............. | H01L 51/5012 |
| | | | | 257/40 |

FOREIGN PATENT DOCUMENTS

| | | | |
|---|---|---|---|
| CN | 102184937 A | | 9/2011 |
| KR | 20100012254 | * | 2/2010 |
| WO | 2013/069045 A1 | | 5/2013 |
| WO | WO2013/088904 | * | 6/2013 |
| WO | 2013/105556 A1 | | 7/2013 |
| WO | WO2013/136039 | * | 9/2013 |

* cited by examiner

ORGANIC LIGHT EMITTING DIODE DISPLAY

This application claims the benefit of Korea Patent Application No. 10-2013-0104765 filed on Sep. 2, 2013, which is incorporated by reference for all purposes as if fully set forth herein.

BACKGROUND

Field of the Disclosure

The present disclosure relates to an organic light emitting diode display having a uniform light emission efficiency (or, 'luminous efficiency') throughout the entire pixel area. Especially, the present disclosure relates to an organic light emitting diode display having an organic light emitting layer in which the light emission efficiency of the blue light wavelength has the same level of light emission efficiency as the other light wavelengths.

Discussion of the Related Art

Nowadays, various flat panel display devices are developed for overcoming many drawbacks of the cathode ray tube such as heavy weight and high volume. The flat panel display devices include the liquid crystal display device (or LCD), the field emission display (or FED), the plasma display panel (or PDP), and the electroluminescence device (or EL).

The electroluminescence display device is categorized into the inorganic light emitting diode display device and the organic light emitting diode display device according to the luminescence material. As a self-emitting display device, the electroluminescence display device has the merits that the response speed is fast, the brightness is high, and the view angle is wide.

FIG. 1 is a diagram illustrating the structure of an organic light emitting diode according to Related Art. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode generates light due to the energy from an excition formed at an excitation state in which the hole and the electron are recombined at the emission layer EML.

The organic light emitting diode display can image video data by controlling the amount (or 'brightness') of the light generated and radiated from the emission layer ELM of the organic light emitting diode as shown in FIG. 1.

The organic light emitting diode display (or OLED) using the organic light emitting diode can be categorized as a passive matrix type organic light emitting diode display (or PMOLED) or an active matrix type organic light emitting diode display (or AMOLED).

The active matrix type organic light emitting diode display (or AMOLED) shows the video data by controlling the current applied to the organic light emitting diode using a thin film transistor (or TFT).

FIG. 2 is a circuit diagram illustrating the structure of one pixel in the active matrix organic light emitting diode display (or AMOLED) according to Related Art. FIG. 3 is a plane view illustrating the structure of one pixel in the AMOLED according to Related Art. FIG. 4 is a cross sectional view along the cutting line I-I' for illustrating the structure of the AMOLED also of Related Art.

Referring to FIGS. 2 and 3, the active matrix organic light emitting diode display comprises a switching thin film transistor ST, a driving thin film transistor DT connected to the switching thin film transistor ST, and an organic light emitting diode OLED connected to the driving thin film transistor DT. The scan line SL, the data line DL, and the driving current line VDD are formed on the substrate SUB to define the pixel area. The organic light emitting diode OLED is formed within the pixel area to define the light emitting area.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the scan line SL, a semiconductor channel layer SA overlapping with the gate electrode SG, a source electrode SS and a drain electrode SD. The driving thin film transistor DT acts for driving an anode electrode ANO of the organic light emitting diode OLED disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED. The organic light emitting layer OLE is inserted between the anode electrode ANO and the cathode electrode CAT. The cathode electrode CAT is connected to the base voltage (or, ground voltage) VSS. There is a storage capacitor Cst disposed between the gate electrode DG of the driving thin film transistor DT and the driving current line VDD or between the gate electrode DG of the driving thin film transistor DT and the drain electrode DD of the driving thin film transistor DT.

Referring to FIG. 4 in more detail, on the substrate SUB of the active matrix organic light emitting diode display, the gate electrodes SG and DG of the switching thin film transistor ST and the driving thin film transistor DT, respectively, are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the gate contact hole GH penetrating the gate insulator GI. The passivation layer PAS is deposited on the substrate SUB having the switching thin film transistor ST and the driving thin film transistor DT.

As mentioned above, the substrate SUB having the thin film transistors ST and DT has uneven surfaces and level differences because there are many elements. It is preferable for the organic light emitting layer OLE to be formed on an even surface to ensure uniform light emitting distribution over the entire area of the organic light emitting layer OLE. Therefore, in order to make the surface of the substrate SUB smooth, the over coat layer OC is deposited over the substrate SUB.

On the over coat layer OC, an anode electrode ANO of the organic light emitting diode OLED is formed. Here, the anode electrode ANO is connected to the drain electrode DD of the driving thin film transistor DT via the pixel contact hole PH formed at the over coat layer OC and the passivation layer PAS.

On the substrate SUB having the anode electrode ANO, a bank (or 'bank pattern') BN is formed over the area having the switching thin film transistor ST, the driving thin film transistor DT and the various lines DL, SL, and VDD, for defining the light emitting area. The exposed portion of the anode electrode ANO by the bank BN would be the light emitting area. On the anode electrode ANO exposed from the bank BN, the organic light emitting layer OLE is formed. On the organic light emitting layer OLE, the cathode electrode CAT is formed.

FIG. 4 illustrates an example of the full-color bottom emission type organic light emitting diode display. In this case, the color filter CF may be further included between the over coat layer OC and the passivation layer PAS, and the anode electrode ANO may be made of the transparent conductive material. The organic light emitting layer OLE may include an organic material emitting white light. Further, the organic light emitting layer OLE and the cathode electrode CAT may be deposited as covering the whole surface of the substrate.

In order to represent the natural full color with the organic light emitting diode display as mentioned above, the color reproduction range of the light emitted from each pixel is important. However, in the related art of the organic light emitting diode display, many developers are concerned with the manufacturing process, the driving voltage, or efficiency more than on the color reproduction range. That is, the technology for the organic light emitting diode display has been developed by accepting a lot of the degradation of the color reproduction range.

However, as the mass production technology is required at a high level, it is more important to manufacture an organic light emitting diode display having an excellent video quality. In order to enhance the video quality, it is important to ensure the uniformity of the light emitting efficiency over all pixels.

SUMMARY

In order to overcome the above mentioned drawbacks, an advantage of the present invention is to disclose an organic light emitting diode display having uniform light emission efficiency over the entire pixel area. Another advantage of the present invention is to disclose an organic light emitting diode display having a uniform color reproduction range over all display panels without increasing manufacturing cost, manufacturing process complexity, and the production tack time, and/or degrading the production yield.

In order to accomplish the above advantages, the present disclosure illustrates an organic light emitting diode display comprising: a substrate having a red pixel area, a green pixel area, and a blue pixel area arrayed in a matrix; an anode electrode in the red, the green, and the blue pixel areas; a hole injection layer including an organic material having an extinction coefficient less than about 0.13 and on the anode electrode covering a whole surface of the substrate; an emission layer on the hole injection layer; an electron injection layer on a whole surface of the emission layer; and a cathode electrode on a whole surface of the electron injection layer.

In one embodiment, the hole injection layer has a thickness of 50 nm to 100 nm.

In one embodiment, the emission layer includes: a red emission layer formed in the red pixel; a blue emission layer formed in the blue pixel; and a green emission layer formed in the green pixel.

In one embodiment, the organic light emitting diode display further comprises: a red color filter formed in the red pixel; a green color filter formed in the green pixel; and a blue color filter formed in the blue pixel, and wherein the emission layer includes: a blue organic light emitting layer covering the whole surface of the hole injection layer; and a green organic light emitting layer disposed on the whole surface of the blue organic light emitting layer.

In one embodiment, the blue organic light emitting layer includes: a blue hole transport layer disposed on the whole surface of the hole injection layer; a blue emission layer disposed on the whole surface of the blue hole transport layer; a blue electron transport layer disposed on the whole surface of the blue emission layer; and a N-type carrier generating layer disposed on the whole surface of the blue electron transport layer, and wherein the green organic light emitting layer includes: a P-type carrier generating layer disposed on the whole surface of the N-type carrier generating layer; a green hole transport layer disposed on the whole surface of the P-type carrier generating layer; a green emission layer disposed on the whole surface of the green hole transport layer; and a green electron transport layer disposed on the whole surface of the green emission layer.

Further, the present disclosure illustrates an organic light emitting diode display comprising: a substrate having a red pixel area, a green pixel area, and a blue pixel area arrayed in a matrix; an anode electrode in the red, the green, and the blue pixel areas; a hole injection layer including an organic material having an extinction coefficient higher than about 0.13 and having a thickness of 2 nm to 15 nm, and on the anode electrode covering a whole surface of the substrate; an emission layer on the hole injection layer; an electron injection layer on a whole surface of the emission layer; and a cathode electrode on a whole surface of the electron injection layer.

In one embodiment, the emission layer includes: a red emission layer formed in the red pixel; a blue emission layer formed in the blue pixel; and a green emission layer formed in the green pixel.

In one embodiment, the organic light emitting diode display further comprises: a red color filter formed in the red pixel; a green color filter formed in the green pixel; and a blue color filter formed in the blue pixel, and wherein the emission layer includes: a blue organic light emitting layer covering the whole surface of the hole injection layer; and a green organic light emitting layer disposed on the whole surface of the blue organic light emitting layer.

In one embodiment, the blue organic light emitting layer includes: a blue hole transport layer disposed on the whole surface of the hole injection layer; a blue emission layer disposed on the whole surface of the blue hole transport layer; a blue electron transport layer disposed on the whole surface of the blue emission layer; and a N-type carrier generating layer disposed on the whole surface of the blue electron transport layer, and wherein the green organic light emitting layer includes: a P-type carrier generating layer disposed on the whole surface of the N-type carrier generating layer; a green hole transport layer disposed on the whole surface of the P-type carrier generating layer; a green emission layer disposed on the whole surface of the green hole transport layer; and a green electron transport layer disposed on the whole surface of the green emission layer.

According to the present disclosure, the characteristics of the hole injection layer for the organic light emitting diode is enhanced to ensure the uniformed light emission efficiency in which the deviation of the light emission efficiency is restricted within 5%. For one example in which the hole injection layer includes an organic material of which extinction coefficient is less than about 0.13, the deviation of the light emission efficiency would be within 5% for all color pixels including red, green and blue pixels. For another example in which the hole injection layer includes an organic material of which extinction coefficiency is higher than about 0.13, the hole injection layer has thickness of 2 nm to 15 nm to ensure that the deviation of the light emission efficiency would be within 5% for all color pixels including red, green and blue pixels.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the disclosure.

In the drawings.

DETAILED DESCRIPTION OF THE ILLUSTRATED EMBODIMENTS

Figure 1:
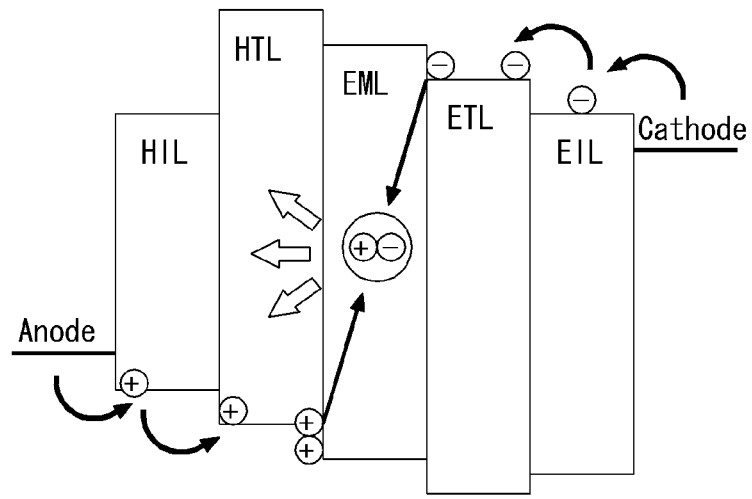
FIG. 1 is a diagram illustrating the structure of the organic light emitting diode according to the related art.
Figure 2:
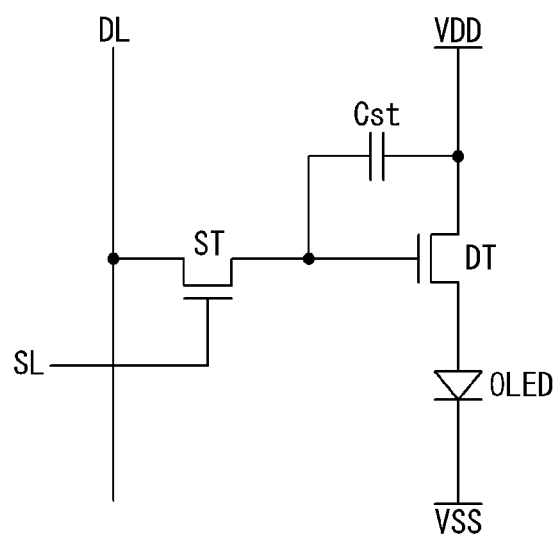
FIG. 2 is the exemplary circuit diagram illustrating the structure of one pixel in the active matrix organic light emitting diode display (or AMOLED) according to the related art.
Figure 3:
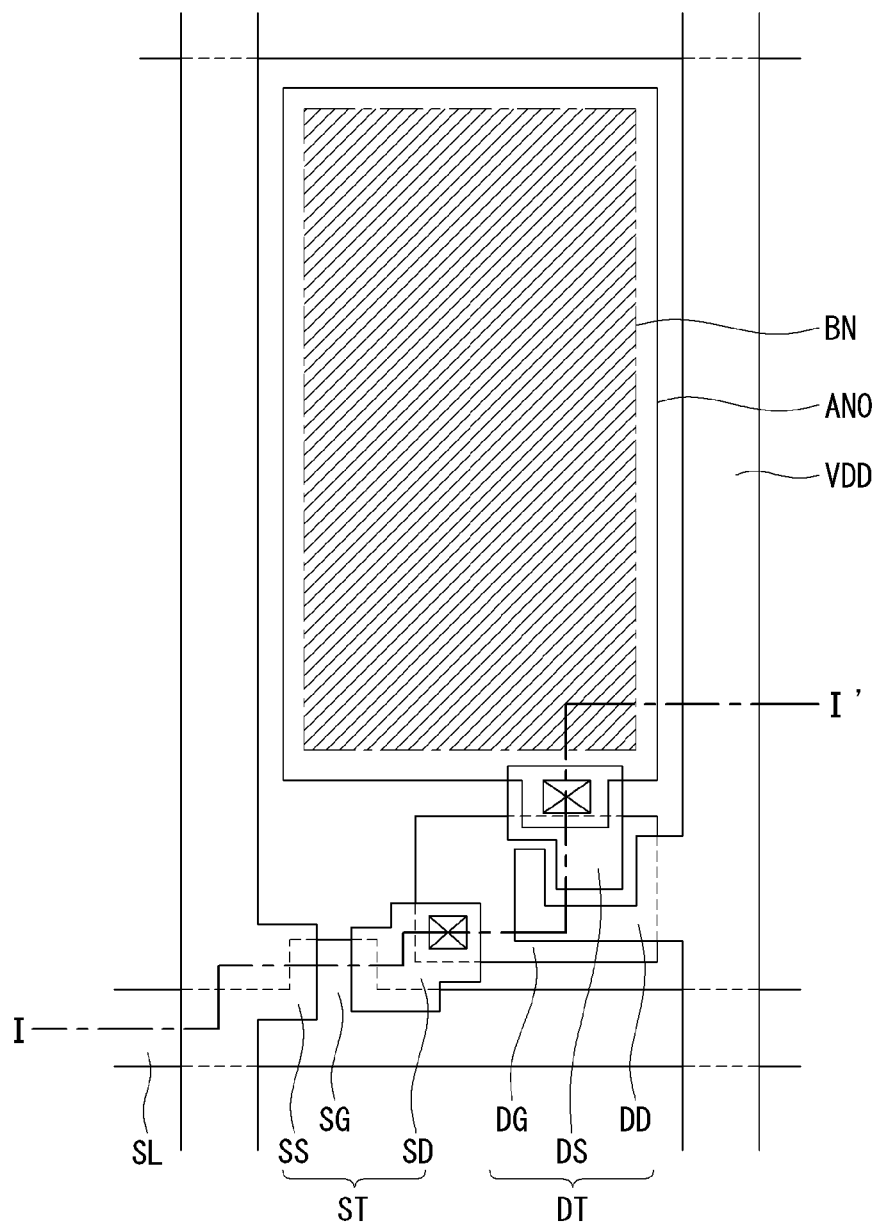
FIG. 3 is a plane view illustrating the structure of one pixel in the AMOLED according to the related art.
Figure 4:
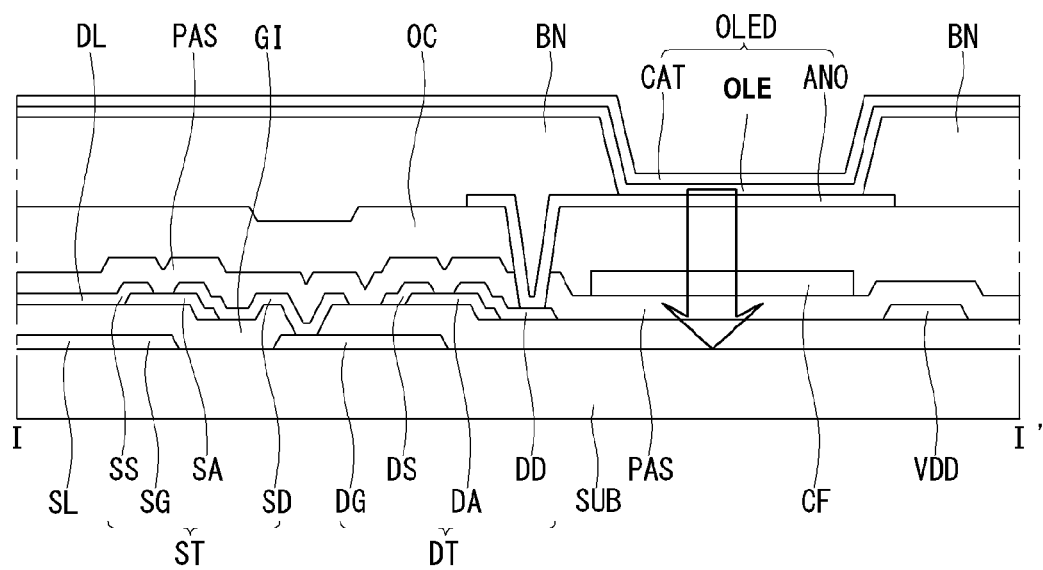
FIG. 4 is a cross sectional view along the cutting line IT in the FIG. 3 for illustrating the structure of the AMOLED according to the related art.

Referring to attached figures, preferred embodiments of the present disclosure will be explained. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
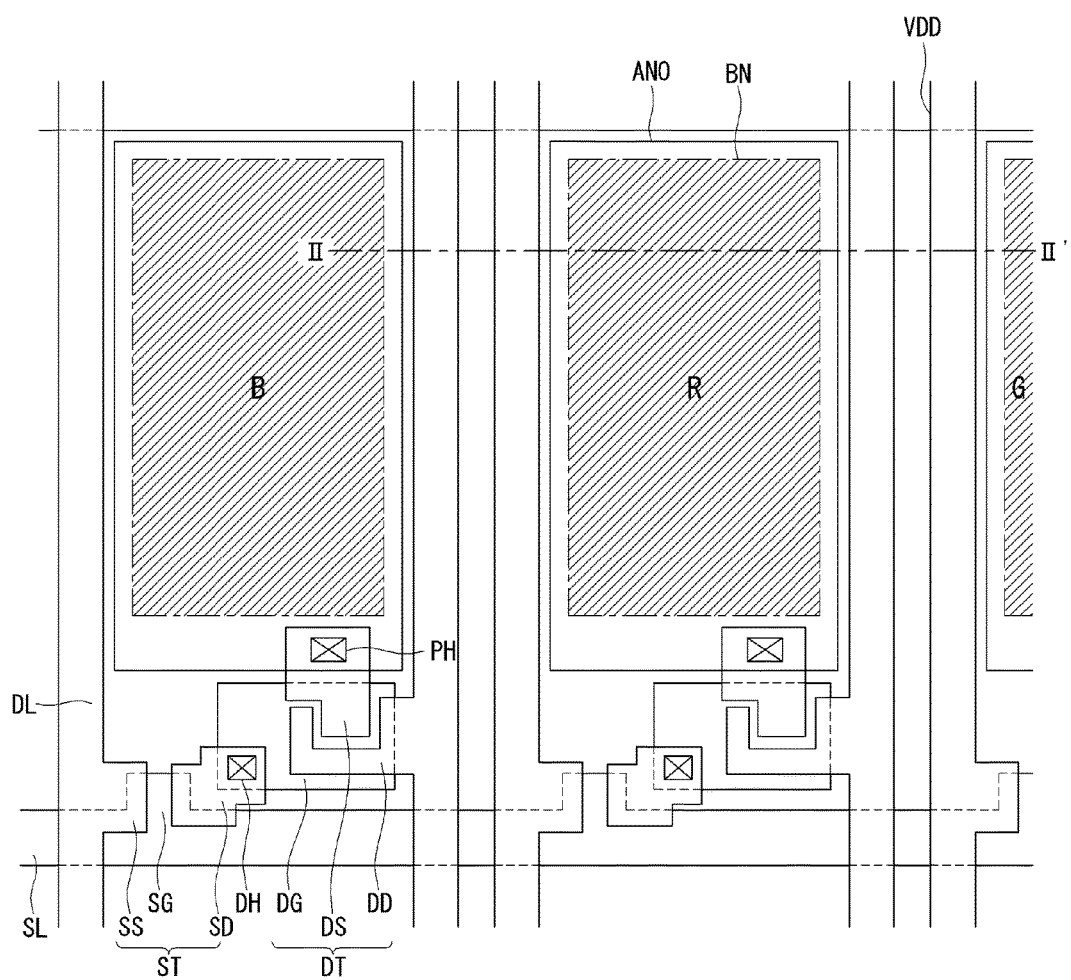
FIG. 5 is a plan view illustrating an exemplary structure of an organic light emitting diode display according to the present disclosure.
Figure 6:
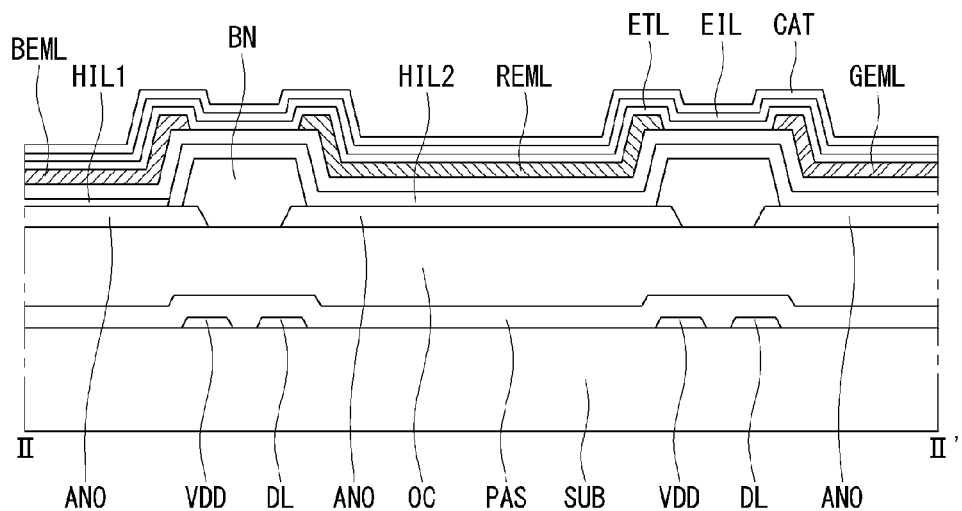
FIG. 6 is a cross sectional view along the cutting line II-II' in the FIG. 5 for illustrating a structure of an AMOLED according to the first exemplary embodiment of the present disclosure.

Hereinafter, referring to FIGS. 5 and 6, an organic light emitting diode display according to the first exemplary embodiment of the present disclosure will be explained. FIG. 5 is a plan view illustrating the structure of an organic light emitting diode display according to the present disclosure. FIG. 6 is a cross sectional view along the cutting line II-II' in the FIG. 5 for illustrating the structure of an AMOLED according to the first exemplary embodiment of the present disclosure. The various examples according to the present disclosure have their own features on the cross-sectional views. Therefore, FIG. 5 is used for the plan view for the various examples.

Referring to FIGS. 5 and 6, an organic light emitting diode display according to the first embodiment of the present disclosure has a plurality of pixels disposed in a manner of R(red)-G(green)-B(blue) array. In each pixel, an organic light emitting diode may be disposed. The organic light emitting diode comprises an anode electrode ANO, an organic light emitting layer OLE and a cathode electrode CAT.

The organic light emitting layer OLE includes a hole injection layer HIL, a hole transport layer HTL, an emission layer EML, an electron transfer layer ETL and an electron injection layer EIL. Theses stacked layers include the organic materials. Here, for the emission layer EML, a red emission layer REML is disposed in the red pixel area, a green emission layer GEML is disposed in the green pixel area, and a blue emission layer BEML is disposed in the blue pixel area.

There are many methods for stacking the organic light emitting layer OLE. In the first embodiment, the hole injection layer HIL and the hole transport layer HTL may be first deposited on the whole surface of the substrate SUB. Theses layers cover most of all area of the substrate as a one layer. Especially, the hole injection layer HIL includes a first hole injection layer HIL1 having a first thickness and disposed within the blue pixel, and a second hole injection layer HIL2 having a second thickness and disposed within the other pixels (red pixel and green pixel). After that, in each pixel area, any one of the red emission layer REML, the green emission layer GEML, and the blue emission layer BEML is deposited in accordance with the manner of color allocation. Lastly, the electron transfer layer ETL and the electron injection layer EIL are deposited on the whole surface of the substrate SUB.

In this structure, light from the red emission layer REML, the green emission layer GEML, and the blue emission layer BEML are radiated to the top side or the bottom side, so the color is generated. For example, in the case of the top emission type, light from the red emission layer REML, the green emission layer GEML, and the blue emission layer BEML pass through the electron transfer layer ETL and the electron injection layer EIL and radiate through the cathode electrode CAT. In this case, there is no or only tiny deviations over all color pixels in the light emission efficiency (or 'color reproduction range').

For another example, in the case of the bottom emission type, the light from the red emission layer REML, the green emission layer GEML, and the blue emission layer BEML pass through the hole transport layer HTL and the hole injection layer HIL and radiate through the anode electrode ANO. In this case, the blue light (less than 460 nm wavelength) may have at least 20% degraded light emission efficiency.

To solve this problem, it is very important to understand the reason of the degradation of the light emission efficiency (or 'color reproduction range'). In the present disclosure, the optical characteristics of the organic materials included in the organic light emitting layer OLE are analyzed. As a result, the hole injection layer HIL is the main element for reducing the light emission efficiency of the blue light.

By analysis, the light emission efficiency of the blue light is compared in various cases. At first, an experiment for the variations of the light emission efficiency according to the thickness of the hole injection layer HIL was conducted. The following Table 1 shows the variations of the light emission efficiency of the blue emission layer BEML in accordance with the thickness of the hole injection layer HIL in the blue pixel. Table 2 shows the variations of the light emission efficiencies of the red emission layer REML and the green emission layer GEML in accordance with the thickness of the hole injection layer HIL in the red and green pixels. To measure and/or evaluate the light emission efficiency, the equation 'Lumen/Watt' may be used for the measuring/evaluating value. Otherwise, the internal quantum efficiency (IQE) or the external quantum efficiency (EQE) may be used for the the measuring/evaluating value. Here, for the light emission efficiency, the 'external quantum efficiency (EQE)' as the measuring value is used for convenience.

TABLE 1

| Thickness of the hole injection layer in blue pixel (nm) | Driving voltage of OLED (V) | Light Emission Efficiency (EQE) |
| --- | --- | --- |
| 2 | 4.0 | 8.30 |
| 10 | 4.0 | 8.25 |
| 20 | 4.2 | 7.80 |
| 30 | 4.4 | 7.50 |
| 40 | 4.6 | 6.90 |

Referring to Table 1, as the thickness of the hole injection layer HIL in the blue pixel is thicker, the light emission efficiency is lowered. Further, when the thickness of the hole injection layer is thicker than 20 nm, the light emission efficiency is lowered even though the driving voltage is increased. The thickness of the hole injection layer HIL in the blue pixel would be less than 20 nm for ensuring a high light emission efficiency. Consequently, in the blue pixel, it is preferable that the thickness of the hole injection layer HIL would be selected from 2 nm to 15 nm thicknesses for keeping the light emission efficiency deviation within 5%.

TABLE 2

| Thickness of the hole injection layer in red and green pixels (nm) | Driving voltage of OLED (V) | Light Emission Efficiency (EQE) |
| --- | --- | --- |
| 2 | 3.6 | 71.2 |
| 10 | 3.6 | 71.6 |
| 20 | 3.6 | 70.9 |
| 30 | 3.6 | 71.3 |
| 40 | 3.6 | 71.5 |

Referring to above Table 2, for the red and green pixels, the light emission efficiencies can be uniform regardless of the thickness variations of the hole injection layer HIL. In the Table 2, the driving voltage of the OLED is 3.6V for convenience. It is preferable that the driving voltage of the OLED would be 4V in red, green, and blue pixels.

In the first embodiment of the present disclosure, the first hole injection layer HIL1 of the blue pixel is 2~15 nm for ensuring the uniformed light emission efficiency over all pixel areas including red, green, and blue pixels. In the interim, in the red and green pixels, the second hole injection layer HIL2 is preferable to have a thickness of 50~100 nm, even though the light emission efficiency is not affected by the thickness of the hole injection layer HIL2, for the 4V of the driving voltage.

A method for disposing the hole injection layer HIL with different thicknesses, is illustrated as follows. On the substrate SUB having the anode electrode ANO, an organic material used for hole injection layer HIL is deposited with the first thickness of 2 nm~15 nm. After that, while placing a screen mask opening the red and green pixels but blocking the blue pixel on the substrate SUB, the organic material is deposited until the thickness i.e., the second thickness, is 50 nm~100 nm.

Referring to FIG. 6, the organic light emitting diode display according to the first embodiment of the present disclosure comprises a blue pixel area including a first hole injection layer HIL1 having thickness of 2 nm~15 nm on an anode electrode ANO, and a red and a green pixel areas including a second hole injection layer HIL2 having thickness of 50 nm 100 nm on the anode electrode ANO. That is, the first embodiment suggests an organic light emitting diode display in which the hole injection layer HIL of the blue pixel area has a different thickness than that of the other pixel areas.

On the hole injection layer HIL (including the first and second hole injection layers HIL1 and HIL2), a hole transport layer HTL is deposited over the entire surface of the substrate SUB. On the hole transport layer HTL, a red emission layer REML, a green emission layer GEML, and a blue emission layer BEML are disposed in each red, green, and blue pixels, respectively. And then, an electron transfer layer ETL is deposited over the entire surface of the substrate SUB. On the electron transfer layer ETL, an electron injection layer EIL is also deposited over the entire surface of the substrate SUB. Finally, on the electron injection layer EIL, a cathode electrode CAT is also deposited over the entire surface of the substrate SUB.

Doing so, the organic light emitting diode display according to the first embodiment of the present disclosure ensures uniform light emission efficiency over the whole surface of the substrate SUB. In the first embodiment, the hole injection layer HIL covering the whole surface of the substrate should have different thicknesses. This requires somewhat difficult or complex manufacturing process. Further, the mass production yield would be lowered or the manufacturing tact time would be longer.

Figure 7:
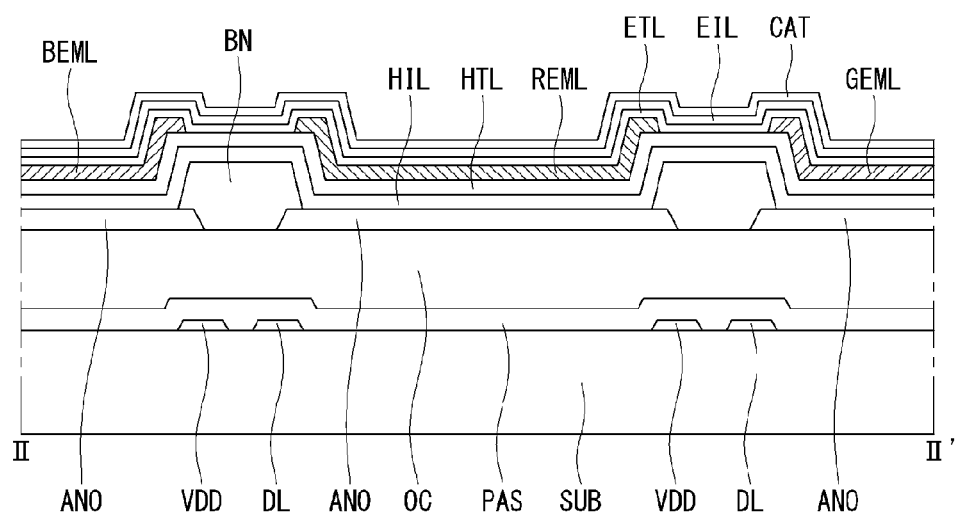
FIG. 7 is a cross sectional view along the cutting line II-II' in the FIG. 5 for illustrating a structure of an AMOLED according to the second exemplary embodiment of the present disclosure.

Hereinafter, the second embodiment of the present disclosure for resolving the manufacturing problems in the first embodiment is described. FIG. 7 is a cross sectional view along the cutting line II-II' in the FIG. 5 for illustrating a structure of an AMOLED according to the second exemplary embodiment of the present disclosure.

In the second embodiment, an organic light emitting diode display in which the hole injection layer HIL has the same thickness over the entire substrate is disclosed, and there is no deviation in light emission efficiency. In the second embodiment, a reason for reducing the light emission efficiency in the blue pixel area is analyzed. As a result, it is found that the extinction coefficient, k, (or 'light absorptivity') of the hole injection layer HIL is directly related to the light emission efficiency. Here, the extinction coefficient refers to several different measures of the absorption of light in a medium and is a parameter defining how strongly a substance absorbs light at a given wavelength.

Figure 10:
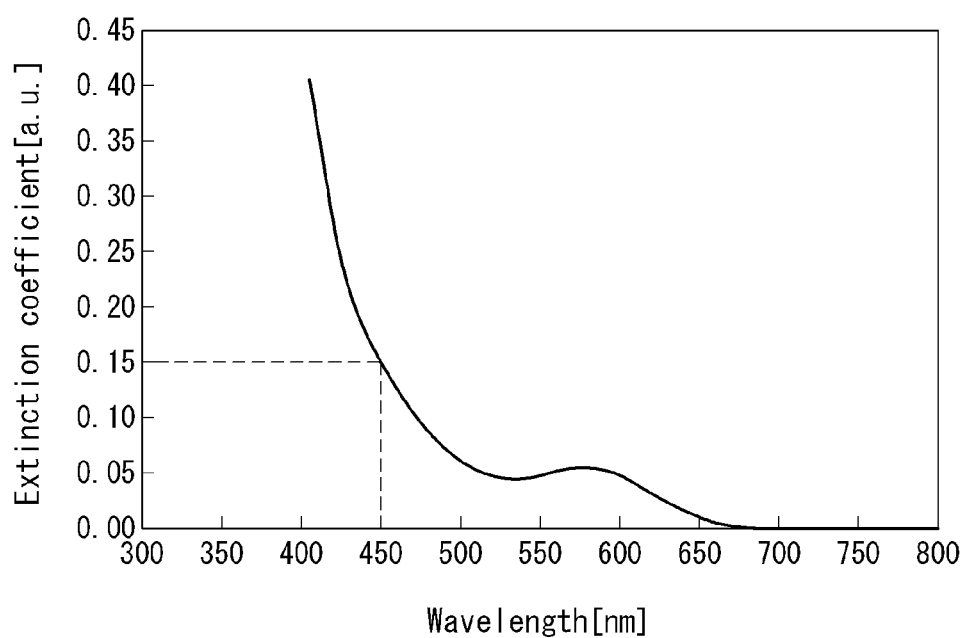
FIG. 10 is a graph illustrating the extinction coefficient when each wavelength of the visible lights are irradiated onto the organic material for the hole injection layer.

FIG. 10 is a graph illustrating the extinction coefficient for each wavelength of visible light irradiated onto the organic material for the hole injection layer HIL. Referring to FIG. 10, the materials used for the hole injection layer has the extinction coefficient of higher than 0.15 for light having a wavelength lower than blue light (450 nm). On the contrary, for the red or green light wavelengths, the extinction coefficient of the hole injection layer is less than 0.10. That the extinction coefficient is abruptly increased at the blue light wavelength means that the hole injection layer HIL is easily absorbing the light having the blue wavelength.

However, the hole injection layer has the extinction coefficient which is about 0.05 for green and red wavelengths. That means, the organic material used for hole injection layer HIL does not absorb the red and green light wavelengths. Therefore, selecting the hole injection layer HIL from the organic light emitting materials of which extinction coefficients are less than about 0.13, the light emission efficiency of the hole injection layer can be uniform throughout visible light wavelengths.

Further, when the extinction coefficient of the organic material for the hole injection layer HIL is greater than about 0.13, in accordance with the variations of the thickness as shown in Table 1, the light emission efficiency has larger deviations for the blue pixel. However, when the extinction coefficient of the organic material for the hole injection layer HIL is less than 0.13, the deviation of the light emission efficiency over all blue pixel areas of the substrate is less than 5%, regardless of the thickness of the hole injection layer. In addition, for the red and green pixels, the light emission efficiency can be uniformly maintained regardless of the thickness of the hole injection layer HIL.

Referring to FIG. 7, the organic light emitting diode display according to the second embodiment comprises a substrate on which a red pixel, a green pixel, and a blue pixel are disposed in a matrix manner. Further, the organic light emitting diode display comprises a hole injection layer HIL having extinction coefficient of about 0.13 or less and thickness of 50~100 nm, on the anode electrode ANO.

On the hole injection layer HIL, a hole transport layer HTL is deposited on the whole surface of the substrate SUB. On the hole transport layer HTL, a red emission layer REML, a green emission layer GEML, and a blue emission layer BEML are disposed within the red, the green, and the blue pixel areas, respectively. Thereon, an electron transport layer ETL is deposited over the whole surface of the substrate SUB. On the electron transport layer ETL, an electron injection layer EIL is also deposited over the whole surface of the substrate SUB. Finally, on the electron injection layer EIL, a cathode electrode CAT is deposited over the whole surface of the substrate SUB.

The organic light emitting diode display according to the second embodiment can ensure the uniformly controlled light emission efficiency of which deviations are within 5% over the whole surface of the substrate SUB. In the first embodiment, controlling the thickness of the hole injection layer HIL can ensure the uniform light emission efficiency within a 5% deviation. In the second embodiment, controlling the extinction coefficient of the hole injection layer can ensure the uniform light emission efficiency within a 5% deviation.

Figure 8:
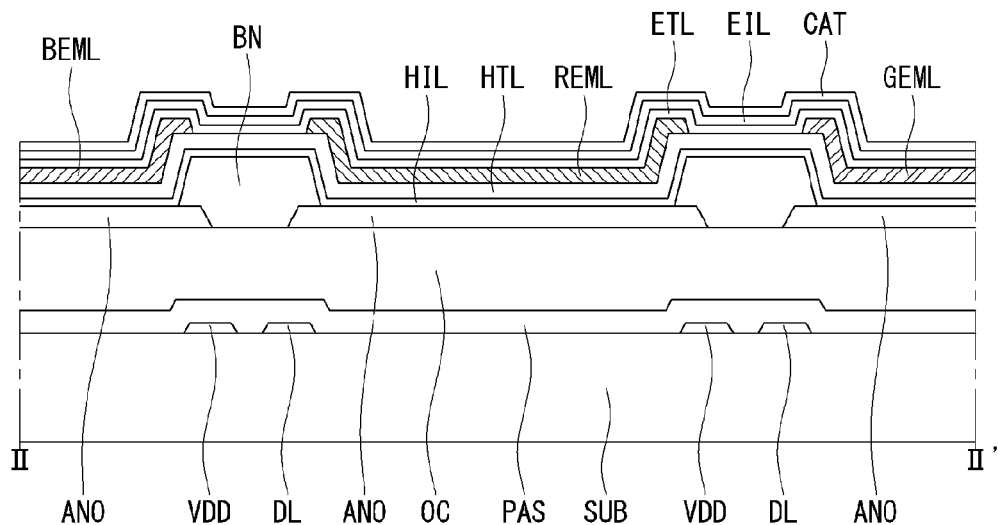
FIG. 8 is a cross sectional view along the cutting line II-II' in the FIG. 5 for illustrating a structure of an AMOLED according to the third exemplary embodiment of the present disclosure.

Hereinafter, referring to FIG. 8, the third exemplary embodiment of the present disclosure will be described. FIG. 8 is a cross sectional view along the cutting line II-II' in the FIG. 5 for illustrating the structure of an AMOLED according to the third exemplary embodiment of the present disclosure.

In the above first embodiment, in order to make the driving voltage for the organic light emitting diode OLED for radiating red and green lights optimized to 4V, the thickness of the hole injection layer HIL is selected between 50 nm to 100 nm. In another method, by controlling the thicknesses of other organic layers rather than the hole injection layer HIL, the driving voltage for the organic light emitting diode OLED can be optimized to 4V.

In the other method, the hole injection layer HIL may be deposited on the substrate SUB with a uniform thickness of 2 nm to 15 nm, regardless of the extinction coefficient. As shown in FIG. 8, an organic light emitting diode display according to the third embodiment comprises a red pixel R, a green pixel G, and a blue pixel B disposed in a matrix manner on a substrate SUB. Further, the organic light emitting diode display comprises a hole injection layer HIL depositing on the anode electrode ANO covering the red pixel R, the green pixel G, and the blue pixel B, wherein the thickness of the hole injection layer HIL is selected between 2~15 nm and the extinction coefficient is about 0.13 or more.

On the hole injection layer HIL, a hole transport layer HTL is deposited over all surface of the substrate SUB. On the hole transport layer HTL, a red emission layer REML, a green emission layer GEML, and a blue emission layer BEML are disposed in each red, green, and blue pixels, respectively. And then, an electron transfer layer ETL is deposited over the entire surface of the substrate SUB. On the electron transfer layer ETL, an electron injection layer EIL is also deposited over the entire surface of the substrate SUB. Finally, on the electron injection layer EIL, a cathode electrode CAT is also deposited over the entire surface of the substrate SUB.

Figure 9:
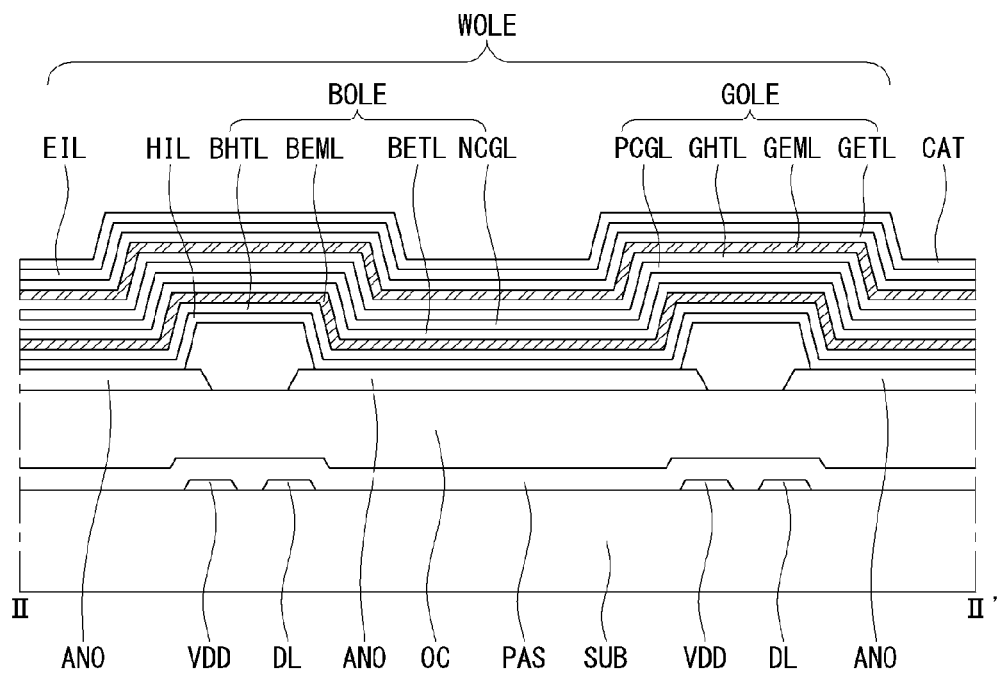
FIG. 9 is a cross sectional view along the cutting line II-II' in the FIG. 5 for illustrating a structure of an AMOLED according to the fourth exemplary embodiment of the present disclosure.

Hereinafter, the fourth exemplary embodiment of the present disclosure is explained. In the fourth embodiment, the organic light emitting diode display includes a white organic light emitting layer WOLE irradiating the white light. FIG. 9 is a cross sectional view along the cutting line II-II' in the FIG. 5 for illustrating the structure of an AMOLED according to the fourth embodiment of the present disclosure.

Referring to FIG. 9, the organic light emitting diode display according to the fourth embodiment comprises a red pixel R, a green pixel G, and a blue pixel B disposed in a matrix manner on a substrate SUB.

On the substrate SUB having the thin film transistors ST and DT, a passivation layer PAS may be deposited. Within each pixel area on the passivation layer PAS, a color filter is disposed for representing the allocated colors. For example, a red color filter RCF is disposed in the red pixel R, a green color filter GCF is disposed in the green pixel, and a blue color filter BCF is disposed in the blue pixel.

As various elements are formed on the substrate SUB, the top surface of the substrate SUB is uneven with various level differences. The organic light emitting layer OLE should be deposited on an even surface to optimize light generation. Therefore, in order to make the top surface of the substrate be even or smooth, an over coat layer OC is deposited on the whole surface of the substrate SUB.

On the over coat layer OC, an anode electrode ANO of the organic light emitting diode OLED is formed. Here, the anode electrode ANO may be connected to the drain electrode DD of the driving thin film transistor DT via the pixel contact hole PH formed at the over coat layer OC and the passivation layer PAS.

On the substrate SUB having the anode electrode ANO, a bank BN is formed covering the switching thin film transistor ST, the driving thin film transistor DT, and various lines DL, SL, and VDD defining the emitting area. The exposed portion of the anode electrode by the bank BN would be the emitting area. On the anode electrode ANO exposed by the bank BN, a white organic light emitting layer WOLE is deposited. Here, the white organic light emitting layer WOLE may be deposited over the whole surface of the substrate SUB. On the white organic light emitting layer WOLE, a cathode electrode CAT is deposited.

The white organic light emitting layer WOLE may have a blue organic light emitting layer BOLE and a green organic light emitting layer GOLE in a stacked structure. As the blue organic light emitting layer BOLE is included into the white organic light emitting layer WOLE, the hole injection layer HIL deposited on the whole surface of the substrate SUB having the anode electrode ANO may be satisfied with any one of the following two conditions.

For one condition, when the hole injection layer HIL has an organic material with extinction coefficient higher than about 0.13, the thickness of the hole injection layer HIL may be selected between 2 nm~15 nm. For another condition, when the hole injection layer HIL has an organic material with extinction coefficient lower than about 0.13, the thickness of the hole injection layer HIL may not be specially restricted. Preferably, for satisfying the 4V driving voltage condition, the hole injection layer HIL may have a thickness between 50 nm~100 nm.

The blue organic light emitting layer BOLE may include a blue hole transport layer BHTL, a blue emission layer BEML, a blue electrode transport layer, and a n-type carrier generating layer NCGL, which are sequentially stacked as covering the whole surface of the substrate SUB on the hole injection layer HIL. Further, the green organic light emitting layer GOLE may include a p-type carrier generating layer PCGL, a green hole transport layer GHTL, a green emission layer GEML, and a green electron transport layer GETL, which are sequentially stacked as covering the whole surface SUB one the blue organic light emitting layer BLOE.

On the green organic light emitting layer GOLE, an electron injection layer EIL may be deposited as covering the whole surface of the substrate SUB. Further, on the electron injection layer EIL, a cathode electrode CAT may be deposited as covering the whole surface of the substrate SUB.

According to the present disclosure, in order to ensure a uniform light emission efficiency within 5% deviation, the organic light emitting diode display comprises a hole injection layer HIL including an organic material with extinction coefficient less than about 0.13. In this case, in order to satisfy the 4V driving voltage condition, it is preferable that the hole injection layer HIL has a thickness between 50 nm to 100 nm. In the interim, for the case that the hole injection layer HIL comprises an organic material with extinction coefficient higher than 0.13, it is preferable that the thickness of the hole injection layer HIL is from 2 nm to 15 nm.

While the exemplary embodiments of the present invention haves been described in detail with reference to the drawings, it will be understood by those skilled in the art that the invention can be implemented in other specific forms without changing the technical spirit or essential features of the disclosure. Therefore, it should be noted that the forgoing embodiments are merely illustrative in all aspects and are not to be construed as limiting the invention. The scope of the embodiments is defined by the appended claims rather than the detailed description of the disclosure. All changes or modifications or their equivalents made within the meanings and scope of the claims should be construed as falling within the scope of the invention.

What is claimed is:

1. An organic light emitting diode display comprising:
   a substrate having a red pixel area, a green pixel area, and a blue pixel area arrayed in a matrix;
   an anode electrode in the red, the green, and the blue pixel areas;
   a hole injection layer on the anode electrode including an organic material with an extinction coefficient from about 0.05 to about 0.13 and covering a whole surface of the substrate;
   an emission layer on the hole injection layer;
   an electron injection layer on a whole surface of the emission layer; and
   a cathode electrode on a whole surface of the electron injection layer.

2. The device according to the claim 1, wherein the hole injection layer has a thickness of 50 nm to 100 nm.

3. The device according to the claim 1, wherein the emission layer includes:
   a red emission layer in the red pixel;
   a blue emission layer in the blue pixel; and
   a green emission layer in the green pixel.

4. The device according to the claim 1, further comprising:
   a red color filter in the red pixel;
   a green color filter in the green pixel; and
   a blue color filter in the blue pixel, and
   wherein the emission layer includes:
      a blue organic light emitting layer covering a whole surface of the hole injection layer; and
      a green organic light emitting layer disposed on a whole surface of the blue organic light emitting layer.

5. The device according to the claim 4, wherein the blue organic light emitting layer includes:
   a blue hole transport layer on the whole surface of the hole injection layer;
   a blue emission layer on a whole surface of the blue hole transport layer;
   a blue electron transport layer on a whole surface of the blue emission layer; and
   a N-type carrier generating layer on a whole surface of the blue electron transport layer, and
   wherein the green organic light emitting layer includes:
   a P-type carrier generating layer on a whole surface of the N-type carrier generating layer;
   a green hole transport layer on a whole surface of the P-type carrier generating layer;
   a green emission layer on a whole surface of the green hole transport layer; and
   a green electron transport layer on a whole surface of the green emission layer.

6. An organic light emitting diode display comprising:
   a substrate having a red pixel area, a green pixel area, and a blue pixel area arrayed in a matrix;
   an anode electrode in the red, the green, and the blue pixel areas;
   a hole injection layer on the anode electrode and including an organic material with an extinction coefficient higher than about 0.13 and having a thickness of 2 nm to 15 nm, and covering a whole surface of the substrate;
   an emission layer on the hole injection layer;
   an electron injection layer on a whole surface of the emission layer; and a cathode electrode on a whole surface of the electron injection layer.

7. The device according to the claim 6, wherein the emission layer includes:
a red emission layer in the red pixel;
a blue emission layer in the blue pixel; and
a green emission layer in the green pixel.

8. The device according to the claim 6, further comprising:
a red color filter in the red pixel;
a green color filter in the green pixel; and
a blue color filter in the blue pixel, and
wherein the emission layer includes:
a blue organic light emitting layer covering a whole surface of the hole injection layer; and
a green organic light emitting layer on a whole surface of the blue organic light emitting layer.

9. The device according to the claim 8, wherein the blue organic light emitting layer includes:
a blue hole transport layer on the whole surface of the hole injection layer;
a blue emission layer on a whole surface of the blue hole transport layer;
a blue electron transport layer on a whole surface of the blue emission layer; and
a N-type carrier generating layer on a whole surface of the blue electron transport layer, and
wherein the green organic light emitting layer includes:
a P-type carrier generating layer on a whole surface of the N-type carrier generating layer;
a green hole transport layer on a whole surface of the P-type carrier generating layer;
a green emission layer on a whole surface of the green hole transport layer; and
a green electron transport layer on a whole surface of the green emission layer.

* * * * *